United States Patent [19]
Nelson

[11] Patent Number: 5,498,987
[45] Date of Patent: Mar. 12, 1996

[54] INTEGRATABLE SOLID STATE RESET CIRCUIT OPERABLE OVER A WIDE TEMPERATURE RANGE

[75] Inventor: Richard E. Nelson, Meridian, Id.

[73] Assignee: Beacon Light Products, Inc., Meridian, Id.

[21] Appl. No.: 262,765

[22] Filed: Jun. 20, 1994

[51] Int. Cl.⁶ .................................................. H03K 17/22
[52] U.S. Cl. ......................... 327/143; 327/142; 327/399; 327/546
[58] Field of Search .................................... 327/142, 143, 327/198, 205, 365, 399, 545, 546, 401, 512; 326/94

[56] References Cited

U.S. PATENT DOCUMENTS

| | | | |
|---|---|---|---|
| 4,196,362 | 4/1980 | Machashi | 327/143 |
| 4,725,747 | 2/1988 | Stein et al. | 307/579 |
| 4,970,408 | 11/1990 | Hanke et al. | 307/272.3 |
| 5,136,181 | 8/1992 | Yukawa | 327/143 |

FOREIGN PATENT DOCUMENTS 3249817  11/1991  Japan ..................................... 327/143
2128831  5/1984  United Kingdom .

*Primary Examiner*—Timothy P. Callahan
*Assistant Examiner*—Dinh T. Le
*Attorney, Agent, or Firm*—John R. Ley

[57] ABSTRACT

A reset circuit asserts, de-asserts and re-asserts a reset signal in response to a voltage applied between first and second nodes to which the reset circuit is connected. The reset signal includes a plurality of transistor switches connected together with positive feedback to achieve latching of the reset signal in either a high or a low state. The different inherent conductivity characteristics of the transistor switches causes the switches to begin closing when the applied voltage is at a first predetermined level and causes the transistor switches to begin opening when the applied voltage achieves a second predetermined lower level. The conductivity characteristics of the transistor switches cause the first and second predetermined levels to slightly vary over temperatures in the range of approximately −50° C. to 150° C., allowing reliable operation over a wide range of temperatures. The reset circuit may be integrated with the circuit which it resets.

16 Claims, 3 Drawing Sheets

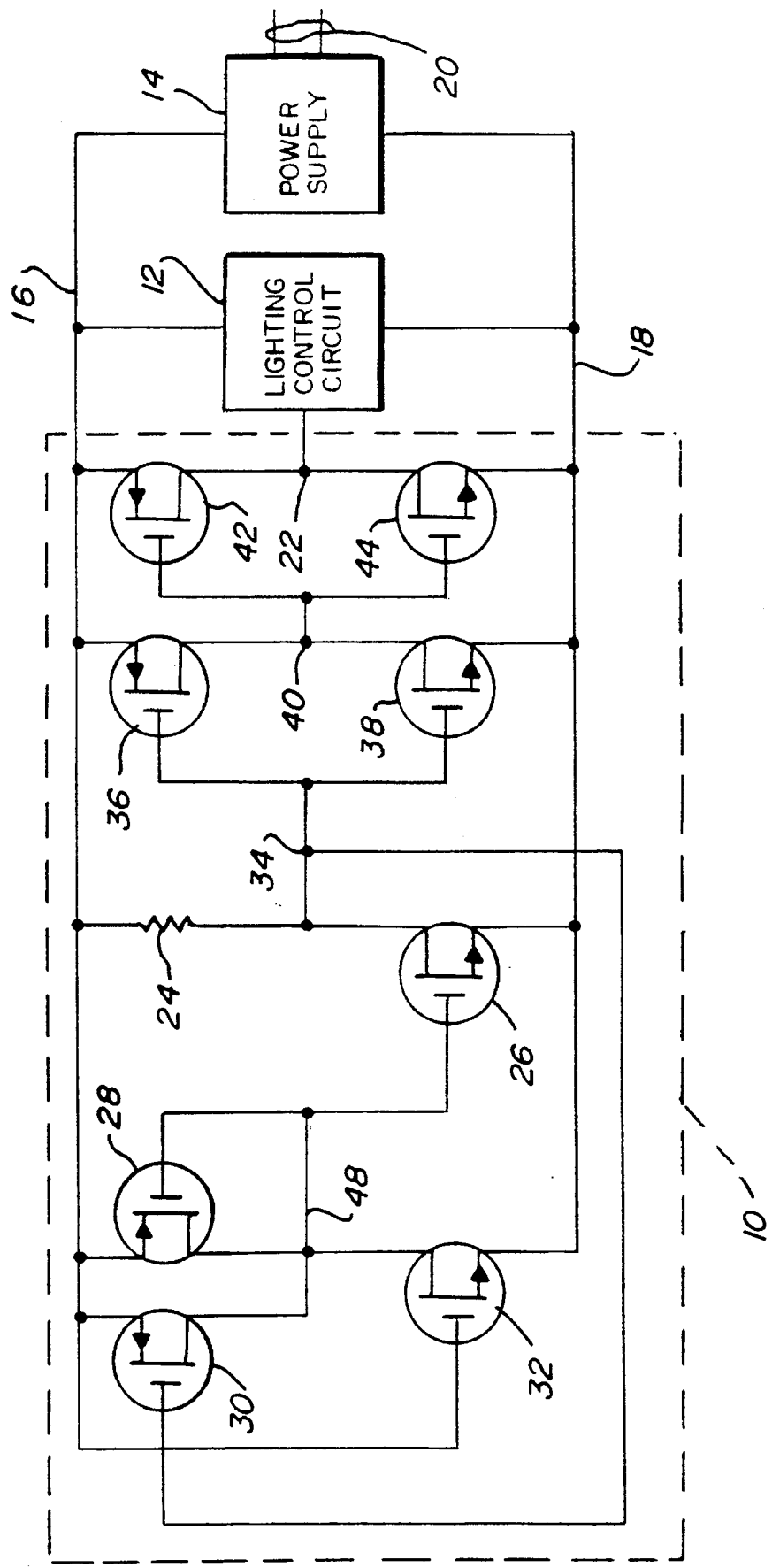
Fig_1

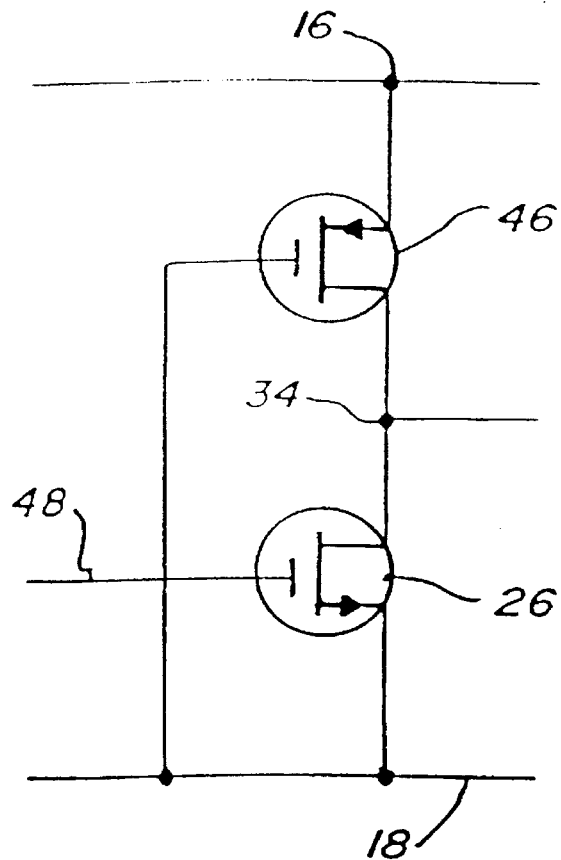
Fig._2
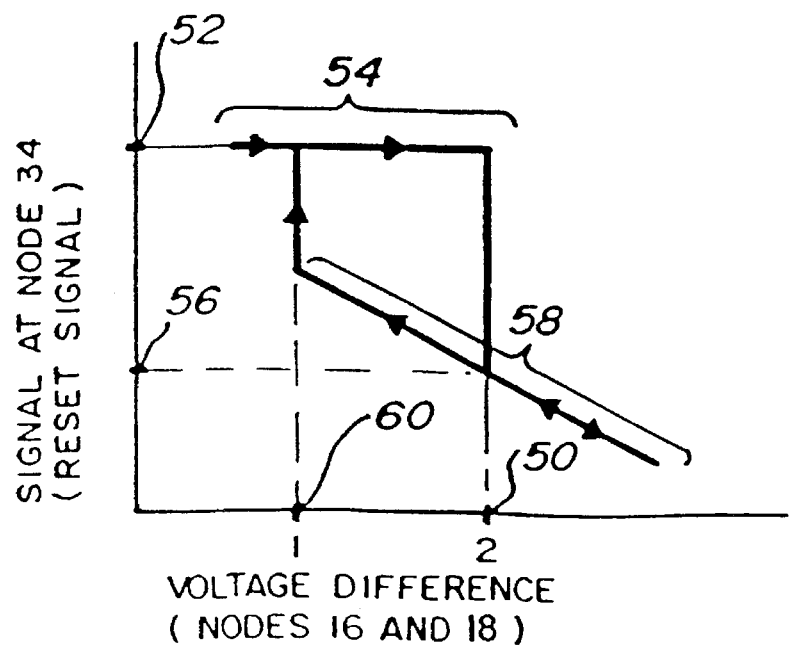
Fig._3

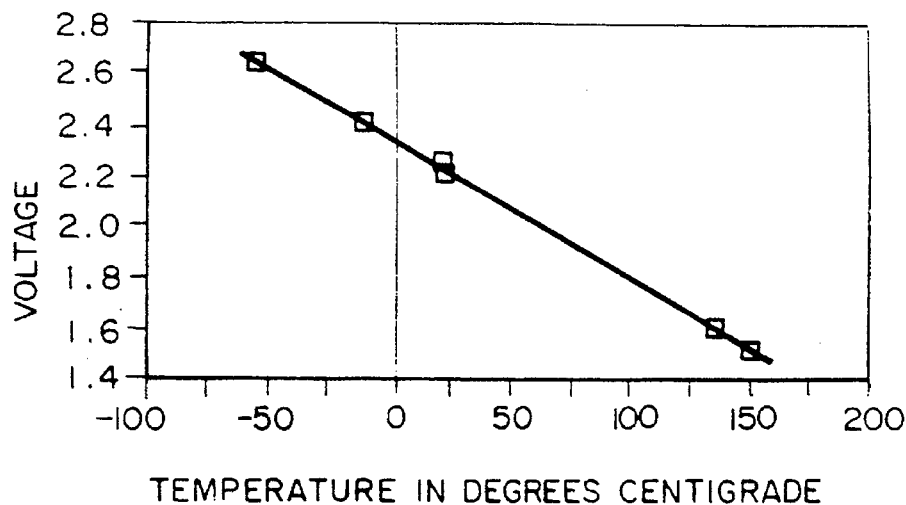
Fig._4
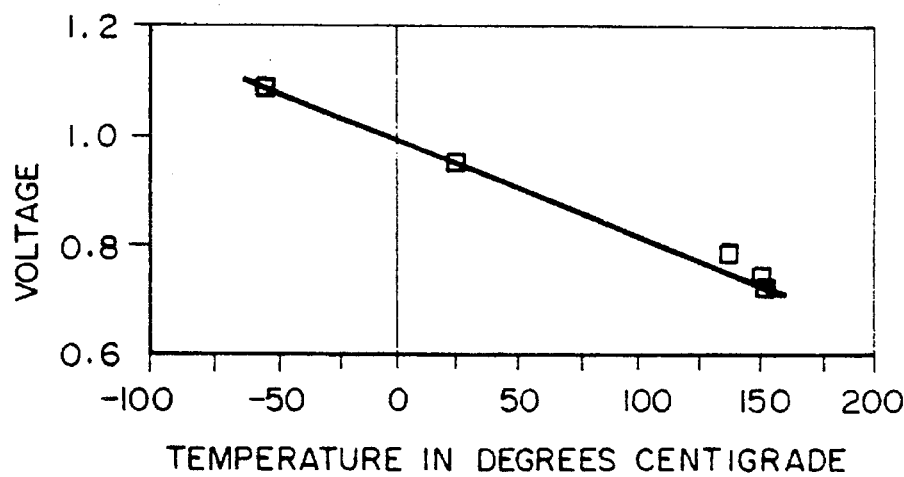
Fig._5
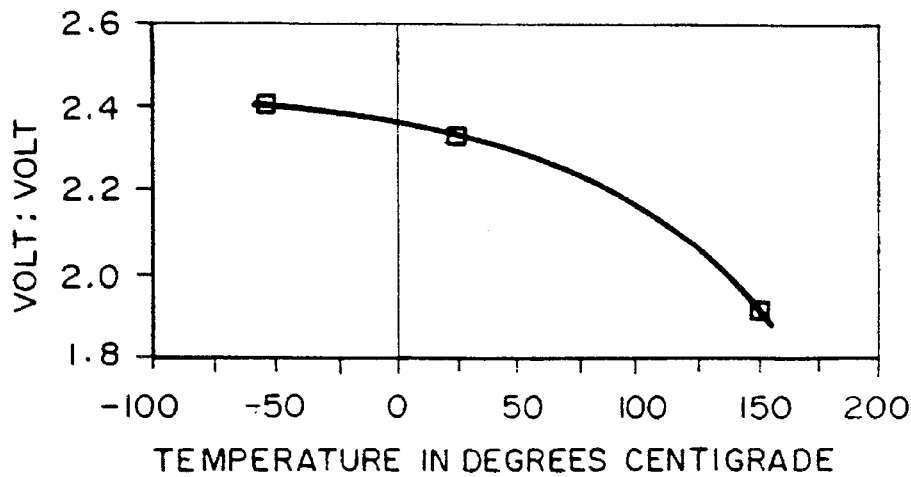
Fig._6

5,498,987

INTEGRATABLE SOLID STATE RESET CIRCUIT OPERABLE OVER A WIDE TEMPERATURE RANGE

This invention relates to a new and improved reset circuit for holding or maintaining logic or circuit elements in a predefined state upon powering up or energizing a logic or other more complex circuit with which the reset circuit is associated. More particularly, the present invention relates to a new and improved solid state reset circuit which is preferably formed entirely by active and resistive elements, which does not require separate reactive or time dependent components, and as a consequence, which is capable of integration into a small space in an integrated circuit with which it is used. Additionally, the new and improved reset circuit of the present invention operates reliably over a relatively wide temperature range while offering increased immunity to power level variations before resetting.

BACKGROUND OF THE INVENTION

A reset circuit is used in many complex logic and control circuits to establish a predefined logical state or condition into which the logic gates and other important functional elements are placed or forced when the circuit is first powered up or energized. If the logic gates and other functional elements do not commence operation from a predetermined state, the functionality of the circuit will be flawed to the point of making the circuit inoperable or unreliable. Without a reset circuit, the logic gates and other functional elements may start in various indeterminate, random and unknown states because these elements usually have slightly different operating characteristics which come into play when the elements are first powered up.

It is generally impossible or difficult to characterize or deal with those varying characteristics without using a reset circuit. Once the elements are powered up and operating, their functionality is reliable and predictable. Indeed it is this predictable functionality which allows such elements to be employed with reliability in complex control, logic and other circuits.

The typical reset circuit uses timing circuit elements which assert a reset signal until the operating voltage reaches a predetermined reliable operating level, at which point the predictable operation of the logic and control elements will prevail. When the reliable operating voltage level is reached, the reset signal is removed or de-asserted. Either the timing elements of the reset circuit can respond directly to the operating voltage level by asserting the reset signal until a capacitor is charged to the predetermined reliable operating voltage, as one example, or the timing elements can respond indirectly to the operating voltage by asserting the reset signal for a predetermined time after which it is assumed that the applied voltage has reached the operating level, as another example. In either case, the reset signal is removed or de-asserted when it is believed that a reliable operating level of voltage has been reached.

One well known type of reset circuit employs a combination of discrete diodes, resistors, and capacitors as the timing circuit elements. A reset circuit of this type consumes a relatively large amount of physical space, making it difficult or impossible to integrate with the other elements of the circuit which it controls. Another disadvantage is that the timing function may vary substantially with temperature, making the reset circuit variable in performance and reliability when used in environments of wide temperature variations. It is usually the characteristics of the capacitor which vary the most with the temperature variation.

Another type of well known reset circuit uses a counter to achieve the timing function. When the circuit is initially powered up, the counter starts incrementing to a selected count value. Until the counter reaches selected count value the reset signal is asserted. Once the selected count value is reached, the reset signal is de-asserted. A counter-type reset circuit offers the advantage of easier integration with the other circuit elements which it controls, because the counter is usually formed primarily by transistors which consume small amounts of space in an integrated circuit compared to the timing capacitor of the discrete component-type of reset circuit. However, the disadvantage to a counter-type reset circuit is that the counter itself is subject to the same problems as the circuit which it is intended to control. Upon initial power up, the counter will start from some random, indeterminate and unknown value, thereby also making the timing function, and hence the reset function, random, indeterminate and variable.

In addition to starting operation of a circuit from a known and predetermined state, a reset circuit also asserts the reset signal after momentary interruptions of electrical power. If the power interruption is of a very short duration, the circuit need not be reset if the voltage drop across the circuit elements is not great enough to cause the then existing states of the circuit elements to be altered. Conventional reset circuits may not distinguish between longer momentary power interruptions which require the circuit to be reset and shorter momentary power interruptions which do not require the circuit to be reset.

It is with respect to these considerations and other background information relative to reset circuits that the significant improvements of the present invention have evolved.

SUMMARY OF THE INVENTION

One aspect of the present invention relates to a new and improved solid state reset circuit which is preferably formed entirely by transistor and resistive elements, thereby making it convenient to integrated along with the other circuit which it controls. Another aspect of the invention relates to a reset circuit which does not require separate reactive or time dependent components, such as capacitors. Further aspects of the invention relate to a reset circuit which operates reliably over a relatively wide temperature range and which offers increased immunity to power variations before resetting.

In accordance with these and other aspects, the reset circuit of the present invention asserts, de-asserts and re-asserts a reset signal in response to a voltage applied between first and second nodes to which the reset circuit is connected. The reset circuit comprises a resistive element connected to the first node and a first controllable switch, preferably a transistor, connected to the second node. The first switch and the resistive element are connected together at a third node, and the reset signal is derived from the third node. A voltage divider is connected between the first and second nodes. The voltage divider includes first and second portions connected together at a fourth node. Preferably the first and second portions of the voltage divider are formed by third and fourth transistors. A second controllable switch, preferably a second transistor, connected between the first node and the fourth node in parallel with the first portion of the voltage divider. The first switch has a control terminal connected to the fourth node. A control signal derived from the voltage at the fourth node operates the first switch to a closed or fully conductive position in which the third node is connected to the second node, and also operates the first switch to an open or fully non-conductive position in which the third node is connected through the resistive element to the first node. The control signal from the fourth node closes the first switch when the voltage across the first and second nodes achieves a first predetermined level of difference and opens the first switch when the voltage across the first and second nodes falls below a second predetermined level of difference. The second switch has a control terminal connected to the third node. A control signal derived from the voltage at the third node operates the second switch to a closed or fully conductive position in which the fourth node is connected to the first node, and also operates the second switch to an open or fully non-conductive position in which the fourth node is connected through the first portion of the voltage divider to the first node. The control signal from the third node opens the second switch upon the first switch opening and closes the second switch upon the first switch closing.

As a result of the connections of the switches, positive feedback is obtained to cause both the first and second switches to open and close together. The resistive element and the voltage divider portions limit the current flow to the transistor switches to assist in rapid switching, by forcing the transistor switches into very low conductive or essentially non-conductive states in the sub-threshold regions of operation. As a result, the reset circuit quickly asserts the reset signal in response to initially powering up the reset circuit, quickly de-asserts the reset signal when the voltage between the first and second nodes reaches the first predetermined level and quickly re-asserts the reset signal when the voltage decreases to the second predetermined lower level. In addition, the conductivity characteristics of the switches, preferably transistors, cause the first and second predetermined levels to vary slightly over temperature variations in the range of approximately −50° C. to 150° C., allowing reliable operation over a wide range of temperatures.

In addition and in accordance with the above and other aspects, the present invention also includes a method of asserting, de-asserting and re-asserting the reset signal in response to the voltage applied between the first and second nodes. The method comprises the steps of connecting the resistive and switch elements as generally referred to above, deriving the reset signal from the voltage at the third node, applying a voltage between the first and second nodes, controlling the conductivity of the first and second switches into a closed, fully conductive state or into an open, fully non-conductive state by creating the control signals at the third and fourth nodes and applying them in the positive feedback manner, while preferably limiting the current flow in the sub-threshold region of operation for quick switching, and varying the inherent conductivity characteristics of the first and second switches to cause the first switch to begin closing when the voltage applied between the first and second nodes achieves the first predetermined level and to cause the second switch to begin opening when the voltage applied between the first and second nodes achieves the second lower predetermined level.

A more complete appreciation of the present invention and its scope can be obtained from the accompanying drawings which are briefly described below, the following detailed description of presented preferred embodiments of the invention, and the appended claims.

BRIEF DESCRIPTION OF THE DRAWINGS

FIG. 1 is a circuit diagram of a reset circuit embodying the present invention, shown connected to a lighting control circuit and a power supply which are shown in block diagram form.

FIG. 2 is a circuit diagram of a portion of an alternate embodiment of the reset circuit shown in FIG. 1.

FIG. 3 is a graph illustrating voltage conditions of assertion, de-assertion and re-assertion of a reset signal generated by the reset circuit shown in FIG. 1, relative to variations in applied voltage.

FIGS. 4 and 5 are graphs illustrating conditions of de-assertion and re-assertion of a reset signal generated by the reset circuit shown in FIG. 1, relative to variations in applied voltage and operating temperature.

FIG. 6 is a graph of the ratio of the re-assertion and de-assertion voltages represented by the graphs of FIGS. 4 and 5, relative to variations in applied voltage and operating temperature.

DETAILED DESCRIPTION

One embodiment of a reset circuit 10 is shown in FIG. 1, connected to a lighting control circuit 12 and a power supply 14. The lighting control circuit 12 is only one example of any type of electrical circuit with which the reset circuit 10 could be employed. A lighting control circuit poses particular problems of environmental temperature which the reset circuit 10 overcomes and therefore has been selected for illustration. The lighting control circuit 12 may be of the type described in U.S. Pat. Nos. 5,030,890, 5,126,634, 5,214,354 and 5,264,761 assigned to the assignee hereof, where a control module is inserted in an incandescent lamp bulb screw-in socket. In this environment, the temperature of the circuit may exceed 125° C., which is regarded as the typical upper temperature limit for rigorous operating requirements of solid state circuits. In the type of lighting control application described in the aforementioned U.S. Patents of the assignee, the circuit 12 may be required to operate reliably at temperatures in the range of 125° C. up to about 200° C. in some circumstances.

The power supply 14 supplies DC operating voltage at nodes 16 and 18, to power the reset circuit 10 and the lighting control circuit 12. Typically most circuits used with the reset circuit 10 will operate from DC voltage. The power supply 14 may be supplied with power from AC power mains 20 or from some other source. When the circuits 10 and 12 are first powered up with DC power from the power supply 14, the voltage between nodes 16 and 18 increases until it reaches the operating or regulated level established by the power supply 14.

The reset circuit 10 responds to the voltage level between nodes 16 and 18, and generates or asserts a reset signal at 22 to the lighting control circuit 12 to hold the components of the circuit 12 in predefined states until the voltage between nodes 16 and 18 reaches a first predetermined level which is sufficient to achieve reliable operation of the circuit 12. Once the voltage level exceeds the first selected level, the reset circuit 10 de-asserts the reset signal, and the circuit elements of the circuit 12 are released from the prescribed states, allowing the circuit 12 to commence operation in its desired and intended manner from a known state. With the operating voltage at nodes 16 and 18 greater than the first predetermined level, the circuit 12 will continue to operate in the reliable manner intended, obtaining its normal functionality. If supply of power is interrupted, the voltage across the nodes 16 and 18 begins to drop. The reset circuit 10 again asserts or re-asserts the reset signal 22 when the voltage across the nodes 16 and 18 decays to a second selected level, which is typically below the first selected level. The second level is usually below the first level because the first level is set higher than that level at which the circuit 12 will reliably operate, just to assure a margin of reliability when the reset signal 22 is de-asserted.

The important functionality of the reset circuit 10 is achieved primarily by a resistance 24 and four metal oxide field effect transistors (MOSFETs) 26, 28, 30 and 32, all of which are connected together and between the nodes 16 and 18. The transistors 26, 28, 30 and 32 create a signal at a node 34 in response to the level of the voltage between nodes 16 and 18. The signal at node 34 is essentially a logical copy of the reset signal at 22. Transistors 36 and 38 form a conventional inverter amplifier to invert and amplify the current level of the signal at 34 and to present the amplified and inverted signal at node 40. Transistors 42 and 44 form another conventional inverter amplifier to invert and amplify the current level of the signal at 40 and to present the amplified and inverted signal as the reset signal at 22. By employing the two stages of inverter amplifier transistors 36, 38 and 42, 44, sufficient amplification is obtained for the reset signal at 22 to drive all of the circuit elements of the circuit 12.

The resistance 24 is connected between the nodes 16 and 34. The resistance 24 has a characteristic impedance, such as one megohm, which is substantially invariant over a broad range of temperatures. The substantial invariance of the resistance 24 permits advantageous operation over a wide range of temperatures. Preferably, the resistance 24 is formed by a polysilicon resistance which is integrated with the other elements of the reset circuit 10, and preferably the other circuit 12 as well.

As an alternative to the polysilicon resistance 24, a transistor 46 may be employed for the essentially same purpose, as is shown in FIG. 2. The source terminal of the transistor 46 is connected to the node 16, the drain terminal is connected to the node 34, and the gate terminal is connected to the node 18. Arranged in this manner, the transistor 46 establishes an essentially fixed and high resistance between its drain and source terminals.

As shown in FIG. 1, the drain terminal of the transistor 26 is connected to the node 34 and the source terminal is connected to the node 18. The gate terminal of the transistor 26 is connected to a node 48. The signal generated on node 48 and the current limiting functionality of the resistance 24 causes the transistor 26 to function as a switch and create essentially either an open circuit or a closed circuit between nodes 34 and 18. When the transistor 26 forms an open circuit, the node 34 is held at a voltage corresponding to the voltage at node 16. Regardless of whether the polysilicon resistance 24 (FIG. 1) or the transistor 46 (FIG. 2) is employed, the voltage at node 34 is the same as the voltage at node 16, until the transistor 26 becomes a closed circuit and conducts current. When the transistor 26 forms a closed circuit, the node 34 is biased at a potential corresponding essentially to the voltage at node 18.

The two transistors 28 and 30 have their source and drain terminals connected to the nodes 16 and 48, respectively. The drain and source terminals of the transistor 32 are connected to the nodes 48 and 18, respectively. The gate terminals of transistors 28, 30 and 32 are connected to the nodes 48, 34 and 16, respectively. The transistor 28 is biased to form a resistance between the nodes 16 and 48. The transistor 32 is biased to form a resistance between the nodes 18 and 48. The transistors 28 and 32 thereby function as a voltage divider, with the voltage at node 48 being in between the voltage between nodes 16 and 18 by the amount of the ratio of the resistances of the transistors 28 and 32. The transistor 30 also has the essential function of a switch as described below.

The conductivity characteristics of transistors 28 and 32 are selected so that when the voltage difference between nodes 16 and 18 is below a first predetermined amount, such as two volts, the transistor 32 is biased into a conductive state. The conducting transistor 32 drops the voltage level of node 48. Even though the voltage at node 48 may be of some indeterminate low value close to the value at node 18, this low bias voltage at the gate of transistor 26 is sufficiently low to bias the transistor 26 into its sub-threshold region of operation. The resistance 24 limits the current available to the transistor 26 to such an extent that the conductivity requirements of the transistor can not be satisfied, even in its sub-threshold region of operation. As a result, the transistor 26 is essentially completely non-conducting. The voltage at node 34 is sufficiently high to bias the transistor 30 into a non-conductive state. The reset circuit 10 is thereby maintained in the condition described. Since the voltage level of the signal at 34 corresponds to the logic level of the reset signal at 22, the reset signal is asserted and remains asserted until the voltage between the nodes 16 and 18 exceeds the first predetermined level.

The reset signal remains asserted while the voltage difference between nodes 16 and 18 increases toward the first predetermined level as is shown in FIG. 3. Until the potential difference between the nodes 16 and 18 reaches the first predetermined level shown at 50, for example two volts, the signal at node 34 is high at a voltage level 52 corresponding to the potential of node 16 as indicated by the curve portion 54. The reset signal at 22 is the high digital logic level is asserted.

Once the potential difference between the nodes 16 and 18 increases to the first selected level at 50, the reset signal is de-asserted as a result of the signal at node 34 dropping to a low level shown at 56 in FIG. 3. At point 56, the potential at node 34 essentially corresponds to the potential at node 18, causing a low logical level of the reset signal 22. The de-assertion of the reset signal under the circumstance of the voltage between nodes 16 and 18 increasing to the point 56 can be understood by reference to FIG. 1. The increase in voltage between the nodes 16 and 18 causes the voltage at node 48 to increase, because the transistors 28 and 32 function similarly to a voltage divider. With the increasing voltage at node 48, transistor 26 begins to conduct because the increasing voltage between nodes 16 and 18 causes the resistance to supply more current to the transistor 26. The signal level at node 34 drops, biasing the transistor 30 into a conductive state. The conductive transistor 30 bypasses the relatively high resistance of the transistor 28, causing the signal level at node 48 to increase even more and further bias the transistor 26 into the conductive state. This additive feedback effect is further enhanced until the transistors 26 and 30 are fully conductive and latched or held in this state by the positive feedback achieved by connecting node 34 to the gate of transistor 30. The signal level at node 34 drops to approximately the level of the voltage at node 18 or the difference between the voltages on nodes 16 and 18, thereby causing the reset signal at 22 to fall to a low logical level and become de-asserted. Additional increases in the potential difference between the nodes 16 and 18 cause the analog value of the signal at node 34 to track such increases, as indicated by the curve portion 58 shown in FIG. 3.

The latched, fully-conductive condition of the transistors 26 and 30 remains until the voltage at node 34 falls to such a small magnitude as to cause the transistor 30 to start turning off, which occurs at a second predetermined voltage difference shown at point 60 in FIG. 3. This second predetermined voltage difference is less than the first predetermined voltage level and is established by the selected conductivity characteristics of the transistor 30. As the transistor 30 starts to turn off the voltage potential at the node 48 begins to decrease toward the voltage at node 18. The bias signal at the gate of transistor 26 decreases, thereby starting to turn off the transistor 26. As transistor 26 turns off, the voltage at node 34 increases toward the potential of node 16, thereby further turning off the transistor 30. This positive feedback turns off transistors 26 and 30 very rapidly.

Even though the voltage at node 34 may be of some indeterminate value close to the value at node 16, this low bias voltage at the gate of transistor 32 is sufficient to bias the transistor 32 into its sub-threshold region of operation. The resistance created by the transistor 30 limits the current available to the transistor 32 to such an extent that the conductivity requirements of the transistor 32 can not be satisfied, even in its sub-threshold region of operation. As a result, the transistor 32 is essentially completely non-conducting. The reset circuit 10 is thereby maintained in the condition described with the reset signal is de-asserted as shown by the voltage at point 52 in FIG. 3.

The plot shown in FIG. 3 forms a hysteresis-like curve. The reset signal is first asserted until the voltage between the nodes 16 and 18 exceeds the first predetermined value shown at point 50. At point 50 the reset signal is de-asserted. The reset signal remains de-asserted until the voltage difference between the nodes 16 and 18 decreases to a smaller value at point 60. At point 60, the reset signal is re-asserted. The difference between the original assertion voltage difference (point 50) and the re-assertion voltage difference (point 60) is achieved by tailoring the conductivity characteristics of the transistors 26, 28, 30 and 32 during the manufacturing process to achieve the functionality described.

The conductivity characteristics of the transistors described may be achieved in numerous ways. One example of satisfactory size arrangements for the transistors used in an embodiment of the reset circuit 10 are as follows. "Size" as referred to in this description is the ratio of the width to the length of the channel of the transistors. The ratio of the size of transistor 42 to the size of transistor 44 is about 2.5 to 1. The ratio of the size of transistor 36 to the size of transistor 38 is also about 2.5 to 1. The size of transistor 42 is about 3.33 times greater than the size of transistor 36. As previously mentioned, the resistance 24 should be about 1 megohm, but a tolerance of plus or minus 30% to this value is also acceptable. When the transistor 46 is used in place of the polysilicon resistance 24 as shown in FIG. 2, the ratio of the size of transistor 26 to the size of transistor 46 is about 27.5 to 1. The ratio of the size of transistor 28 to the size of transistor 32 is about 33.3 to 1. The ratio of the size of transistor 30 to the size of transistor 28 is about 6 to 1.

The hysteresis-like effect of the reset circuit 10 is of particular advantage in avoiding unnecessary resetting from momentary power interruptions when the voltage difference between the nodes 16 and 18 falls below the first predetermined level (point 50, FIG. 3) but stays above the second lower predetermined level (point 60, FIG. 3). In this situation, the voltage difference extends along curve 58 but does not reach a level where the circuit 12 fails to operate reliably until the second predetermined level is reached. Thus momentary power interruptions which result in voltage difference levels between points 50 and 60 as shown in FIG. 3 will not result in assertion of the reset signal. The distraction of having to initiate operation of the circuit 12 again is avoided in these circumstances. This particular feature of the invention offers an advantage compared to prior art reset circuits which assert the reset signal, de-assert the reset signal and re-assert the reset signal at approximately the same operational point or condition.

Another advantage of the reset circuit of the present invention relates to its wide temperature range of reliable operation. FIG. 4 illustrates a plot of the difference in voltage between the nodes 16 and 18 (or the voltage of the power supply 14, FIG. 1) at which the reset circuit 10 de-asserts the reset signal. Reliable de-assertion is achieved over the very wide temperature variation of about −55° C. to about 150° C., within which the de-assertion voltage difference between nodes 16 and 18 varies by less than about 1.1 volts. A similar situation is shown in FIG. 5 for the operating temperature range in which the reset circuit 10 re-asserts the reset signal. Reliable re-assertion is achieved over the same very wide temperature variation of about −55° C. to about 150° C., within which the re-assertion voltage between nodes 16 and 18 varies by less than about 0.5 volts. Furthermore the ratio between the de-assertion voltage level and the re-assertion voltage level illustrates the fact that the individual temperature variations on de-assertion and re-assertion have similar effects, and jointly achieve considerable temperature-independent operation of the circuit 10. FIG. 6 illustrates the ratio of the voltage between nodes 16 and 18 at which de-assertion and re-assertion occur. As shown in FIG. 6, the ratio of the two voltages varies by the relatively small amount of about 0.6 over the 200° C. operating temperature range.

Because the reset circuit 10 generates a reset signal which is asserted, de-asserted and re-asserted with a relatively small variance over a wide temperature range, the reset circuit is particularly advantageous in achieving a reliable and predictable starting state for operation of the circuit which it controls. The reset circuit can be effectively utilized together with electrical circuits which must be operated over a range of temperatures or at high temperatures, such as the assignee's lighting control modules. This advantage also allows the reset circuit to be integrated along with the circuit which it controls in a single integrated circuit. Also, because the reset circuit 10 is formed entirely of solid state elements with no capacitors or other space consuming components, the reset circuit may be easily integrated in a small space. Since the reset circuit 10 does not require a capacitor for operation, problems associated with the capacitors in existing reset circuits are avoided.

Presently preferred embodiments of the present invention and many of its improvements have been described with a degree of particularity. These descriptions are of preferred examples for implementing the invention, and the scope of the invention should not necessarily be limited by this description. The scope of the present invention is defined by the following claims.

The invention claimed is:

1. A reset circuit for asserting, de-asserting and re-asserting a reset signal in response to a variable application voltage applied between two nodes to which the reset circuit is connected, comprising:

a resistive element connected to a first one of the nodes to which the reset circuit is connected;

a first switch connected to a second one of the nodes to which the reset circuit is connected, the first switch also connected to the resistive element at a third node which is separate from the first and second nodes, the first switch having a control terminal to which the application of a first bias signal of one characteristic causes the first switch to exhibit an open or substantially nonconductive state and to which the application of the first bias signal of another characteristic causes the first switch to exhibit a closed or substantially conductive state;

the voltage at the third node constituting the reset signal;

a voltage divider connected between the first and second nodes, the voltage divider having a fourth node which is separate from the first, second and third nodes, the voltage divider establishing a voltage at the fourth node which is intermediate of said variable application voltage;

the control terminal of the first switch is connected to the fourth node;

the fourth node supplying the first bias signal to the first switch;

a second switch connected between the first node and the fourth node and also connected in parallel with a portion of the voltage divider between the first and fourth nodes, the second switch having a control terminal to which the application of a second bias signal of one characteristic causes the second switch to exhibit an open or substantially nonconductive state and to which the application of the second bias signal of another characteristic causes the second switch to exhibit a closed or substantially conductive state;

the control terminal of the second switch is connected to the third node;

the third node supplying the second bias signal to the second switch;

wherein the resistive element applies the voltage from the first node to the third node when said variable application voltage is below a first predetermined level, the voltage at the third node constituting an asserted reset signal until the first predetermined level of said variable application voltage is reached;

the first predetermined level of said variable application voltage develops the first bias signal at the fourth node to close the first switch, the closed first switch causing current to flow through the resistive element and thereby decrease the voltage at the third node and de-assert the reset signal;

the decrease in voltage at the third node when the reset signal is de-asserted establishing the second bias signal at the control terminal of the second switch to close the second switch, the closed second switch causing the voltage at the fourth node to create the first bias signal at the control terminal of the first switch to close the first switch;

a decrease in said variable application voltage after the reset signal has been de-asserted resulting in maintenance of the de-asserted reset signal until said variable application voltage reaches a second predetermined level which is less than the first predetermined level;

the second predetermined level of said variable application voltage causing the voltage at the fourth node to attain a level approaching the voltage established by the voltage divider at the fourth node and to thereby create the first bias signal at the control terminal of the first switch to open the first switch and cause the voltage at the third node to increase and re-assert the reset signal after the reset signal has previously been de-asserted;

the re-assertion of the reset signal creating the first bias signal at the control terminal of the first switch to open the first switch and to further increase the voltage at the third node;

the reset signal remaining asserted as said variable application voltage increases from the second predetermined level to the first predetermined level;

the reset signal remaining de-asserted as said variable application voltage decreases from the first predetermined level to the second predetermined level; and the connection of the control terminal of the first switch to the fourth node and the connection of the control terminal of the second switch to the third node establishing positive feedback for de-asserting and asserting the reset signal.

2. A reset circuit as defined in claim 1 wherein:

the first switch comprises a first transistor;

the second switch comprises a second transistor; and the first and second transistors have predetermined different conductivity characteristics which in conjunction with the positive feedback operatively cause the first and second predetermined levels for assertion, de-assertion and re-assertion of the reset signal.

3. A reset circuit as defined in claim 1 wherein:

the first switch is a first transistor, the first transistor having a control terminal connected to the fourth node, the first transistor conducting and essentially not conducting to achieve the closed and open states of the first switch, respectively;

the second switch is a second transistor, the second transistor having a control terminal connected to the third node, the second transistor conducting and essentially non-conducting in the closed and open states of the second switch, respectively;

the control signals applied to control terminals of the first and second transistors from the fourth and third nodes, respectively, biasing the first and second transistors into the sub-threshold regions of operation during the non-conducting states of the first and second transistors;

the resistive element limiting the current available to the first transistor when the voltage between the first and second nodes is less than the first predetermined level to an amount insufficient to support essentially any conduction of the first transistor; and the second portion of the voltage divider limiting the current available to the second transistor when the voltage between the first and second nodes is less than the second predetermined level to an amount insufficient to support essentially any conduction of the second transistor.

4. A reset circuit as defined in claim 1 wherein:

the resistive element comprises a polysilicon resistor.

5. A reset circuit as defined in claim 1 wherein:

the resistive element comprises a transistor biased to create a resistance.

6. A reset circuit as defined in claim 1 wherein:

the resistive element is substantially insensitive to temperature variations in the range of approximately −55° C. to 150° C.

7. A reset circuit as defined in claim 1 wherein the voltage divider comprises:

one transistor connected between the first and fourth nodes, the one transistor having a control terminal connected to the fourth node; and another transistor connected between the fourth and second nodes, the other transistor having a control terminal connected to the first node.

8. A reset circuit as defined in claim 1 further comprising:

at least one amplifier connected to the third node and operative to amplify the signal at the third node to create the reset signal.

9. A reset circuit as defined in claim 1 wherein:

the first switch comprises a first transistor;

the second switch comprises a second transistor;

the portion of the voltage divider between the first and fourth nodes comprises a third transistor;

the portion of the voltage divider between the fourth and second nodes comprises a fourth transistor;

each of the transistors includes a control terminal for controlling the conductivity characteristics of the transistor;

the control terminal of the first transistor is connected to the fourth node;

the control terminal of the second transistor is connected to the third node;

the control terminal of the third transistor is connected to the fourth node;

the control terminal of the fourth transistor is connected to the first node;

the connection of the control terminal of the first transistor to the fourth node and the connection of the control terminal of the second transistor to the third node establishing positive feedback for creating similar conductivity characteristics in the first and second transistors; and the first and second transistors have predetermined different conductivity characteristics which in conjunction with the positive feedback operatively cause the first and second predetermined levels for assertion, de-assertion and re-assertion of the reset signal.

10. A reset circuit as defined in claim 9 wherein:

the resistive element comprises a polysilicon resistor.

11. A reset circuit as defined in claim 9 wherein:

the resistive element comprises a fifth transistor connected between the first and third nodes and having a control terminal connected to the second node.

12. A reset circuit as defined in claim 9 wherein:

the resistive element is substantially insensitive to temperature variations in the range of approximately −55° C. to 150° C.

13. A reset circuit as defined in claim 12 wherein:

the conductivity characteristics of the transistors cause the first predetermined level to vary by less than about 1.1 volts over temperature variations in the range of approximately −55° C. to 150° C.

14. A reset circuit as defined in claim 12 wherein:

the conductivity characteristics of the transistors cause the second predetermined level to vary by less than about 0.5 volts over temperature variations in the range of approximately −55° C. to 150° C.

15. A reset circuit as defined in claim 12 wherein:

the conductivity characteristics of the transistors cause a ratio of the first and the second predetermined levels to vary no more than about 0.6 volts over temperature variations in the range of approximately −55° C. to 150° C.

16. A reset circuit as defined in claim 9 wherein:

the first transistor conducting and essentially not conducting to achieve the closed and open states of the first switch, respectively;

the second transistor conducting and essentially non-conducting in the closed and open states of the second switch, respectively;

the control signals applied to control terminals of the first and second transistors from the fourth and third nodes, respectively, biasing the first and second transistors into the sub-threshold regions of operation during the non-conducting states of the first and second transistors;

the resistive element limiting the current available to the first transistor when the voltage between the first and second nodes is less than the first predetermined level to an amount insufficient to support essentially any conduction of the first transistor; and the fourth transistor limiting the current available to the second transistor when the voltage between the first and second nodes is less than the second predetermined level to an amount insufficient to support essentially any conduction of the second transistor.

* * * * *